United States Patent [19]
Edelstein

[11] Patent Number: 6,106,687
[45] Date of Patent: Aug. 22, 2000

[54] PROCESS AND DIFFUSION BAFFLE TO MODULATE THE CROSS SECTIONAL DISTRIBUTION OF FLOW RATE AND DEPOSITION RATE

[75] Inventor: Daniel C. Edelstein, New Rochelle, N.Y.

[73] Assignee: International Business Machines Corporation, Armonk, N.Y.

[21] Appl. No.: 09/067,572

[22] Filed: Apr. 28, 1998

[51] Int. Cl.[7] ................................................. C25D 21/06
[52] U.S. Cl. ............................ 205/98; 205/123; 204/279
[58] Field of Search ............................. 205/98, 137, 920, 205/159

[56] References Cited

U.S. PATENT DOCUMENTS

| | | | |
|---|---|---|---|
| 2,689,216 | 9/1954 | Nevers et al. | 204/52 |
| 2,923,671 | 2/1960 | Van Tilburg | 204/52 |
| 3,300,396 | 1/1967 | Walker | 204/49 |
| 3,317,410 | 5/1967 | Croll et al. | 204/23 |
| 3,558,464 | 1/1971 | Danna | 204/219 |
| 3,652,442 | 3/1972 | Powers et al. | 204/273 |
| 3,809,642 | 5/1974 | Bond et al. | 204/275 |
| 3,962,047 | 6/1976 | Wagner | 204/15 |
| 4,032,422 | 6/1977 | Ross et al. | 204/224 R |
| 4,233,146 | 11/1980 | Rothmayer et al. | 204/255 |
| 4,304,641 | 12/1981 | Grandia et al. | 204/23 |
| 4,323,438 | 4/1982 | Sesterhenn et al. | 204/128 |
| 4,466,864 | 8/1984 | Bacon et al. | 204/15 |
| 4,469,564 | 9/1984 | Okinaka et al. | 204/15 |
| 4,469,566 | 9/1984 | Wray | 204/23 |
| 4,596,637 | 6/1986 | Kozarkek et al. | 204/67 |
| 4,664,760 | 5/1987 | Jarrett | 204/67 |
| 4,906,341 | 3/1990 | Yamakawa et al. | 204/15 |
| 4,931,150 | 6/1990 | Smith | 204/26 |
| 5,000,827 | 3/1991 | Schuster et al. | 204/15 |
| 5,023,044 | 6/1991 | Negron | 376/213 |
| 5,222,310 | 6/1993 | Thompson et al. | 34/202 |
| 5,228,966 | 7/1993 | Murata | 204/224 R |
| 5,318,683 | 6/1994 | Smith et al. | 204/252 |
| 5,377,708 | 1/1995 | Bergman et al. | 134/105 |
| 5,391,285 | 2/1995 | Lytle et al. | 205/123 |
| 5,429,733 | 7/1995 | Ishida | 204/224 R |
| 5,431,823 | 7/1995 | Gofer | 210/636 |
| 5,435,885 | 7/1995 | Jones et al. | 216/92 W |
| 5,437,777 | 8/1995 | Kishi | 204/224 R |
| 5,443,707 | 8/1995 | Mori | 204/242 |
| 5,447,615 | 9/1995 | Ishida | 204/224 R |
| 5,543,028 | 8/1996 | Herbert et al. | 205/70 |
| 5,804,052 | 9/1998 | Schneider | 205/96 |

OTHER PUBLICATIONS

Equinox, Single Substrate Processing System, Semitool, Advertising Brochure, EQU–025, Apr. 1994 p. 108.

Equinox, Introducing the First Fully End–to–End Plating Prices, Semitool Advertising Brochure, EQU: 1002 6 pp. Dec. 1994.

D. Edelstein, "Advantages of Copper Interconnectors," Jun. 27–79, 1995, VMIC Conference—1995 ISMIC—104/95/0301, pp. 301–307.

D. Edelstein et al., "Full Copper Wiring in a Sub–0.25 um CMOS ULSI Technology," IEEE IEDM, Wash., D.C., Dec. 7–10 (1997).

D. Edelstein, "Integration of Copper Interconnects," ECS 1996, month not available.

Datta et al., Pending Patent Application, "Apparatus and Method for the Electrochemical Etching of a Wafer," Ser. #08/968,190, Filing Date Nov. 12, 1997.

Primary Examiner—Kathryn Gorges
Assistant Examiner—Erica Smith-Hicks
Attorney, Agent, or Firm—Ratner & Prestia; Joseph P. Abate

[57] ABSTRACT

Process and apparatus controlling the cross-sectional flow distribution within a flowing stream such as a copper flux in an electrolytic copper deposition process. The flow distribution is controlled by a baffle comprised of two plates overlying one another, each having a set of openings, wherein the openings in the two plates generally correspond to one another but are slightly offset therefrom or varied in size in a non-uniform way along the radius of the plates such as to effect a modification of the uniformity or non-uniformity of the velocity flow rates across the cross section of the flowing stream in which the baffle is interposed.

17 Claims, 8 Drawing Sheets

PROCESS AND DIFFUSION BAFFLE TO MODULATE THE CROSS SECTIONAL DISTRIBUTION OF FLOW RATE AND DEPOSITION RATE

FIELD OF THE INVENTION

This invention pertains to a process, and a baffle used in that process, for modulating the cross-sectional velocity distribution of a flowing material, particularly a deposition material, and/or modulating the cross-sectional current density distribution, and also for modulating the resulting cross-sectional uniformity of a deposited coating.

BACKGROUND OF THE INVENTION

Controlling the localized flow rate of a deposition material in a deposition process (such as the ion flux in an electrolytic deposition process), to effect greater uniformity of coating on a planer substrate, is well known. See, for example, U.S. Pat. No. 4,304,641 issued to Grandia et al. and assigned to IBM; No. 5,391,285 issued to Lytle et al. and assigned to Motorola; and No. 5,435,885 issued to Jones et al. and assigned to IBM. The use of overlapping baffle plates with a series of openings to control total neutron flow rate in a nuclear reactor is seen in U.S. Pat. No. 5,023,044 issued to Negron and assigned to Babcock & Wilcox.

Notwithstanding these prior art teachings, there remains a need to improve the uniformity of a deposited coating irrespective of position on the deposition substrate. This need is particularly acute in the electrolytic plating of electronic components, wherein uniformity of thickness throughout the area of the coating is a significant factor in the performance of the component. A non-uniform coating may require excessive post-coating treatment (such as chemical mechanical polishing) to obtain the necessary thickness uniformity.

SUMMARY OF THE INVENTION

The present invention comprises a process and apparatus wherein the cross-sectional flow distribution within a flowing stream, such as the copper ion flux in an electrolytic copper deposition process, is controlled by a baffle which has two or more plates overlying one another. Typically the plates are circular. Each of the plates has a set of openings which generally correspond to one another but are slightly offset or off-sized therefrom in a non-uniform way along the radius of the plates, such as to modulate the uniformity or non-uniformity of the velocity flow rates across the cross section of the flowing stream in which the baffle is interposed.

Thus, in an electrolytic copper deposition process, with a semiconductor wafer target to be coated placed in the axial path of the baffle, the baffle consists of two or more circular plates displaced from one another, along a common axis, at least to the extent necessary to permit one of these plates to be rotatable relative to the other. This baffle is slightly displaced axially from the wafer target. Each of the two baffle plates include at least one plurality of openings. The location or size of the individual openings on the two plates is such that, at selected rotational positions of the rotatable plate, the proportion of openings or open area in registration on the two plates differs radially.

For example, at one preselected position of the rotatable plate, the proportion of openings in registration (providing a clear flow-through path for fluid or ion flux flowing through the baffle) may be greater near the axial center of the baffle and less near the outer edge of the baffle, while at other preselected positions of the rotatable plate, the opposite may be true.

It is to be understood that both the foregoing general description and the following detailed description are exemplary, but are not restrictive, of the invention.

BRIEF DESCRIPTION OF THE FIGURES

The invention is best understood from the following detailed description when read in connection with the accompanying figures. It is emphasized that, according to common practice, the various features of the figures are not to scale. On the contrary, the dimensions of the various features are arbitrarily expanded or reduced for clarity. Included are the following figures.

DETAILED DESCRIPTION OF THE INVENTION

The present invention pertains to essentially any process in which redistribution of the velocity or flux gradient across the profile of a flowing stream is desirable. In accordance with the present invention, this redistribution is effected by a flow control baffle comprising a pair of baffle plates, at least one of which is pivotally mounted about a common axis of the baffle plates. Each of the baffle plates include a series of openings, with the location and/or size of the opening on one baffle plate slightly offset or varied with respect to those on the other such that the pivotal rotation of one plate effects a correspondingly changing or variable amount of openings or open area in registration with one another between the two baffle plates, the degree of opening registration varying radially outward from the center of the baffle plates.

The baffle and process of this invention are particularly useful in producing uniform copper deposits in integrated circuit structures and processes such as those described in the publication by D. C. Edelstein et al.

As used in a typical electrolytic deposition process, the baffle plates are disks of a diameter greater than or equal to that of a deposition substrate. Each disk has a series of holes drilled through it to allow ions and fresh plating bath to flow from the anode to the cathode, which in this case is an electronic wafer substrate. These holes are patterned such that different holes on the disks will align with one another as the disks are rotated relative to each other, and those holes that do align will vary radially as a function of relative disk position.

Figure 3A:
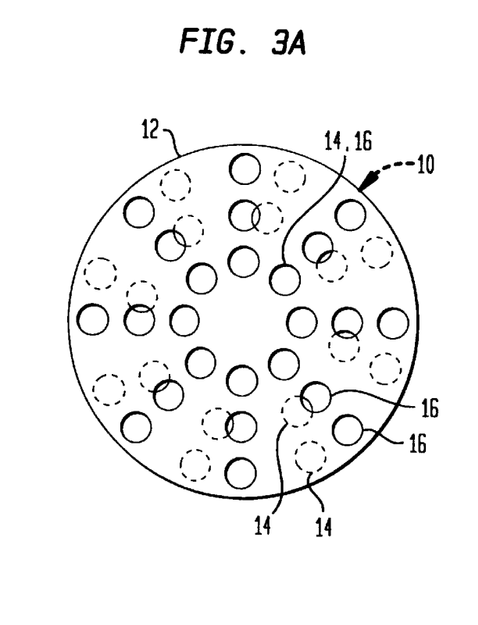
FIGS. 3a, 3b, and 3c show the baffle plates of FIG. 1 as they are used overlying one another and in various adjustable positions to effect the registry of openings therein.
Figure 3B:
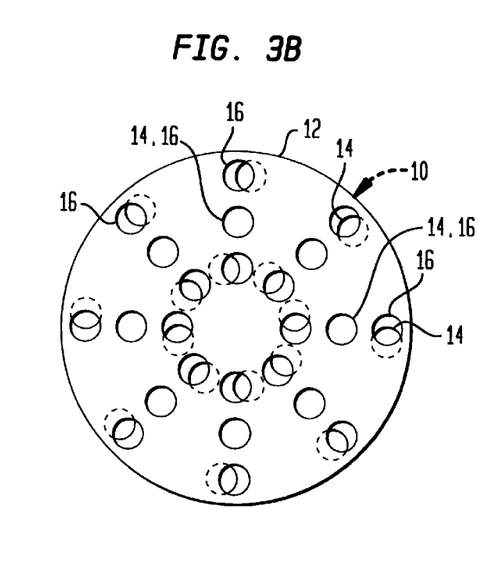
Figure 3C:
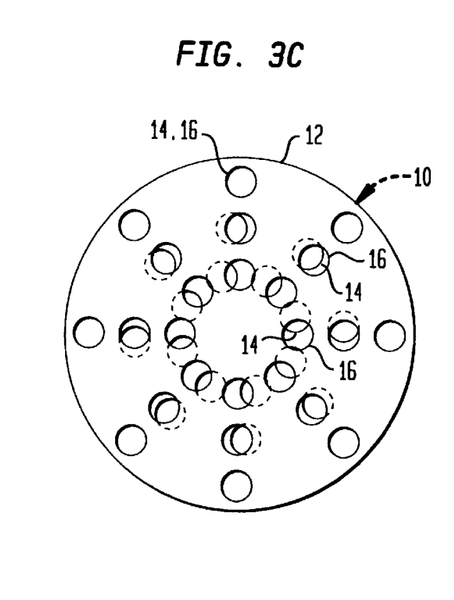

FIG. 3 illustrates this concept for two disks overlayed with different orientations.

The baffle comprised of these disks is placed in the bath at a position between the anode and wafer such that the centers of the wafer and disks are aligned. Ion flux flowing from anode to cathode, through the baffle and toward the wafer substrate cross section, is modulated by positioning the disks such that holes in the respective disks of the baffle, at a given radial distance, align where more deposition is desired, and other holes are not aligned at radial distances where less deposition is desired. The hole pattern on the disks is optimized to achieve the control and sensitivity required for the plating process and conditions used. The rate of deposition depends on the ion flux or current from anode to cathode. This can vary at the edge relative to the center due to variation in ion density caused by the rapid depletion of ions toward the center of the wafer compared to the edge.

Figure 1:
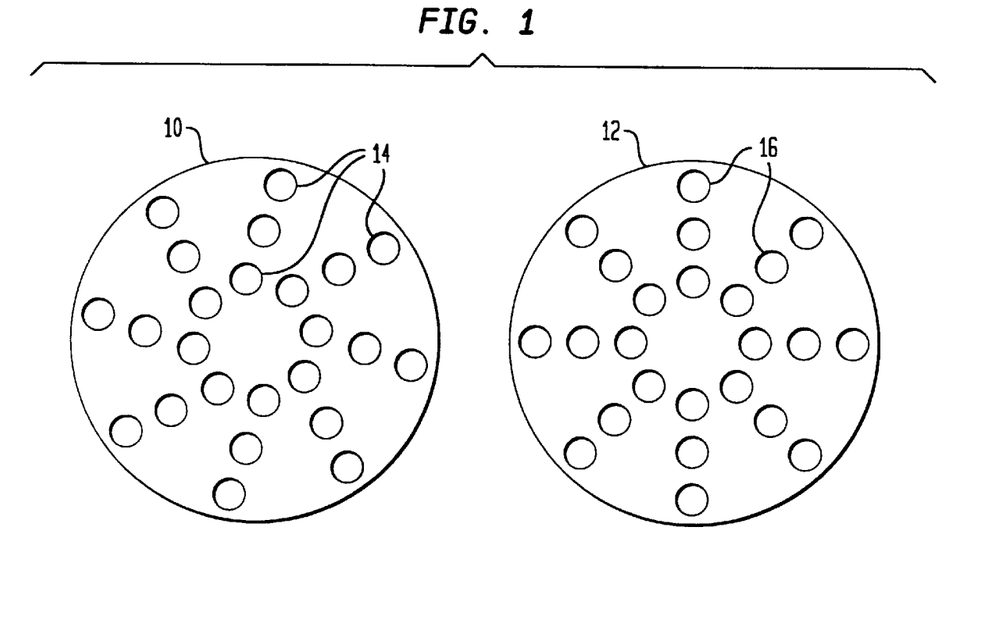
FIG. 1 is a top view of the two plates of a baffle in accordance with one form of the present invention.

More specifically, as shown in FIG. 1, a baffle 8 in accordance with the present invention comprises two plates 10 and 12 adapted to overlay one another, disposed about a common axis with one of the baffle plates pivotable with respect to the other. Openings 14 on baffle plate 10 are disposed as a series of pluralities of openings, each of the pluralities of openings lying along a line extending from the axis of the baffle plate outward and slightly skewed or offset from radial lines thereof. Openings 16 on baffle plate 12 lie along radial lines of baffle plate 12. When baffle plates 10 and 12 are placed over one another, as they are in use, they form varying patterns of openings as shown in FIGS. 3a, 3b, and 3c, depending upon the radial position of the pivotable baffle plate such that the open pathways through the parts of the respective openings 14 and 16, in registry with one another, vary in a manner to effectively redistribute the cross-sectional velocity gradient of the material flowing therethrough.

As illustrated by the three different overlying positions of plates 10 and 12 shown in FIGS. 3a, 3b, and 3c, the open flow-through areas of baffle 8 (i.e., the openings of plates 10 and 12 in registration with one another), in this embodiment, are shown to be proportionately greater near the axial center (FIG. 3a), depending on the rotational position of the plates 10 and 12 relative to one another. By adjusting the rotational position of plates 10 and 12 (typically by rotating one of the plates), placement of baffle 8 in a fluid flowing stream will preferentially permit greater flow near the axial center of the baffle, as seen in FIG. 3a, or near the outer edge of the baffle, as shown in FIG. 3c. In a third preselected position of rotatable adjustment of the rotatable baffle plate, the preferential flow-through pathways of openings in registration with one another may be at a radial location between the inner and outer radial locations, as shown in FIG. 3b.

More generally then, in this embodiment of the invention, the baffle consists of two plates each of which includes multiple openings, the openings on one of the plates being radially disposed and the openings on the other of the plates being non-radially disposed (i.e., along lines forming an angle with radial lines of the plate). Thus, upon rotation of one of the plates relative to the other, the controlled amount of registration between the respective openings in the two plates changes. When rotatably adjusted such that the cross-sectional area of openings in registration is less near the axial center of the plates and greater near the outer edges thereof and, as adjusted, interposed in a fluid flow stream, this baffle will cause fluid flow through the plates to be diminished in its velocity near the axis of the flow stream and increased away from the axis. In the course of the process, as the flow might otherwise tend to concentrate near the center of the electronic wafer target, it would be diverted away from the axis, causing a somewhat enhanced deposition rate toward the edge of the target and away from the axis. In a process where the fluid stream is of a deposition material which tends to be preferentially depleted near the axial center of fluid flow (and thus of the deposition substrate) as the deposition process proceeds, the baffle of this invention should produce greater uniformity of deposition at all radial locations of the target.

Figure 2:
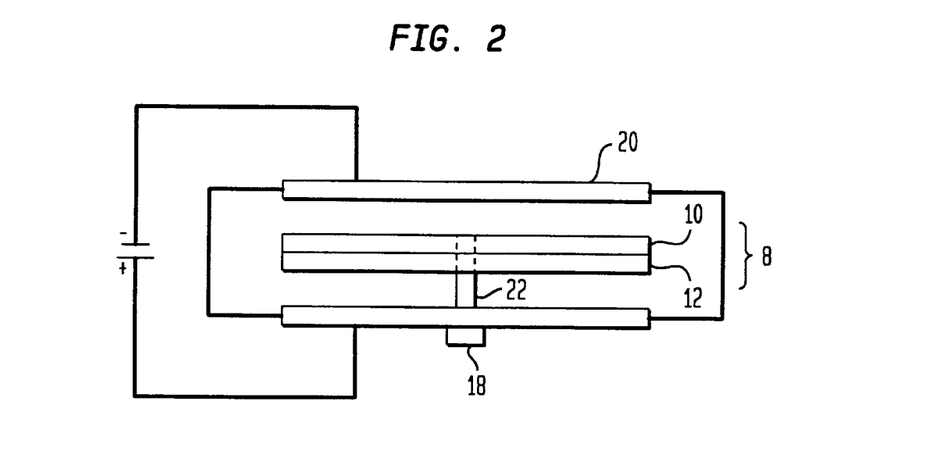
FIG. 2 is a schematic representation of an electrolytic deposition cell in which the baffle of the present invention is used.

As used in a typical application, an electrolytic deposition cell, schematically illustrated in FIG. 2, has an electronic target element 20 on which a copper film is to be deposited. The electronic target element 20 forms one electrode of the electrolytic cell; the other electrode comprises a metallic source, such as copper block 18. With the space between these electrodes filled with an electrolyte, when a voltage is applied across these electrodes, an ion flux develops from the source 18 to the deposition target element 20. Disposed within that flux flow path is baffle 8, in accordance with the present invention, comprising baffle plates 10 and 12 as shown in FIG. 1. Baffle plates 10 and 12 are mounted upon a common axial mounting member 22 and at least one of plates 10 and 12 is rotatable about mounting member 22 so as to permit selective adjustment of the extent of the registration between openings in the two baffle plate members, as shown on FIGS. 3a, 3b, and 3c. As previously described, baffle 8, as used in this manner, should permit controlled modification or modulation of the cross-sectional distribution of velocity or velocity gradient across the flow path of the ion flux.

A mechanical or electrical servo mechanism may be provided to permit the rotational movement of one of plates 10 and 12 relative to the other. Such controlled modulation of the cross-sectional gradient of flux through baffle 8 may also be adjusted in the course of the deposition. For example, at an early stage of the deposition process, the deposition rate across the cross section of the target may be relatively uniform, thus requiring no modulation of the cross-section flow gradient. As the process proceeds, however, the central area of the target may begin to see disproportionately rapid build up. Baffle 8 may then be adjusted to permit proportionately greater flux flow near the outer edge of the target, thus to enhance deposition in that area and better meet the objective of relatively uniform deposition throughout the cross-sectional area of the target.

In a process of this kind without the baffle of the present invention, a wafer surface is exposed to a solution containing copper ions by immersing that surface in a bath containing a copper anode and a suitable electrolyte. The wafer is biased negatively relative to the anode. Copper ions in solution are attracted to the wafer surface where they are precipitated as elemental copper. The rate of deposition depends on the ion flux or current from anode to cathode. Typically, the rate varies at the edge relative to the center due to variation in copper ion density caused by the rapid depletion of copper ions toward the center of the wafer compared to the edge. The present invention modifies that flow by controlling the ion flux distribution from the center to the edge of the wafer by the interposed plating baffle, as described above, thus providing a more uniform deposition rate. In such a process, the deposition is ordinarily continued until a plating on the order of ½ to 2 microns thick has been achieved. Ideally, in accordance with the present invention, such a process would be conducted with the cross-sectional gradient of the copper ion flux modified in such a manner as to effect a thickness variation from the center to the edge of the wafer of no more than ±0.2 microns.

The baffle plates of the present invention must of course be constructed of a material that will not be affected by the deposition material passing therethrough or the bath in which the deposition material may be disposed. Ordinarily the baffle plates of this invention will be of a diameter greater than or equal to the diameter of the target substrate, or electronic wafer, in accordance with the preferred form of the present invention. In selected embodiments, the wafer target will be a semiconductor such as a silicon oxide ceramic disk material with an associated metal element serving as a cathode. The disk target would be on the order of 100 to 300 mm in diameter and the baffle plates of the present invention of roughly corresponding diameters. In a copper plating bath with a sulfuric acid electrolyte, these plates would be constructed of an acid resistant, non-conductive material, such as polymethyl methacrylate (for example, the material commonly sold under the trademarks "Plexiglass" (by Rohm & Haas) or "Lucite" (by DuPont)). These plates would be on the order of about 1.6 to 6.4 mm (1/16 to ¼ inch) thick, with a spacing on the order of 25 mm or more (1 to several inches) between the the baffle and the facing anode and cathode (target) of the cell. With plating current on the order of 1 to 20 amps, copper coatings on the order of 0.5 to several microns with thickness variations of less than 10% are believed to be producible with the present invention.

The baffle plates themselves may be simply disks with a series of holes (each on the order of about 4.8 to 9.5 mm or 3/16 to 3/8 inches in diameter for the 100–300 mm target substrates in the specific embodiment described above) drilled through each disk to allow ions to flow from the anode to the cathode. The holes are patterned such that different holes on the two disks will not align perfectly as the disks are rotated relative to one another and those disk openings that do align will vary radially as a function of relative disposition. To accomplish that end, in the preferred form of the present invention, the openings on each of the disks comprise at least four, or preferably eight or more, pluralities of openings, the openings in one of the disks being disposed along radial lines thereof and the openings in the pluralities in the other disk are disposed along lines extending from near the axis to the edge of the disk but skewed or at an angle to the radial lines thereof. Typically the amount of that skewing or angular disposition with respect to a radial line crossing the center of such a plurality of holes will be on the order of 10–25%.

Used as described in an electrolytic bath in which ions are driven by electromotive force from a metallic source to a deposition substrate, ion flux from the anode to the cathode across the wafer is modulated by positioning the disks such that the holes at a given radial distance align where more deposition is desired and holes are not aligned at a radial distance where less deposition is desired. Thus, the hole pattern on the respective baffle plates is optimized to achieve the control and sensitivity required for the optimum deposition plating process in conditions used.

As contrasted with the copper deposition process described above, the baffle of the present invention may also be used in other processes, such as the electrolytic deposition of a lead-tin coating for forming solder bumps on an integrated circuit chip. In this case, the thickness of the coating may be on the order of 100 microns but thickness uniformity is a significant concern.

In still another embodiment of the invention, a resist pattern may be used to selectively deposit the metal in selected areas of the target substrate surface.

Ordinarily, surface polishing is necessary, following plating, to effect a desired coating surface smoothness. In those embodiments where a resist pattern is used to effect selective deposition on the substrate surface, such polishing may also be necessary to remove coating from non-selected areas and thus to achieve a final pattern configuration.

Figure 4:
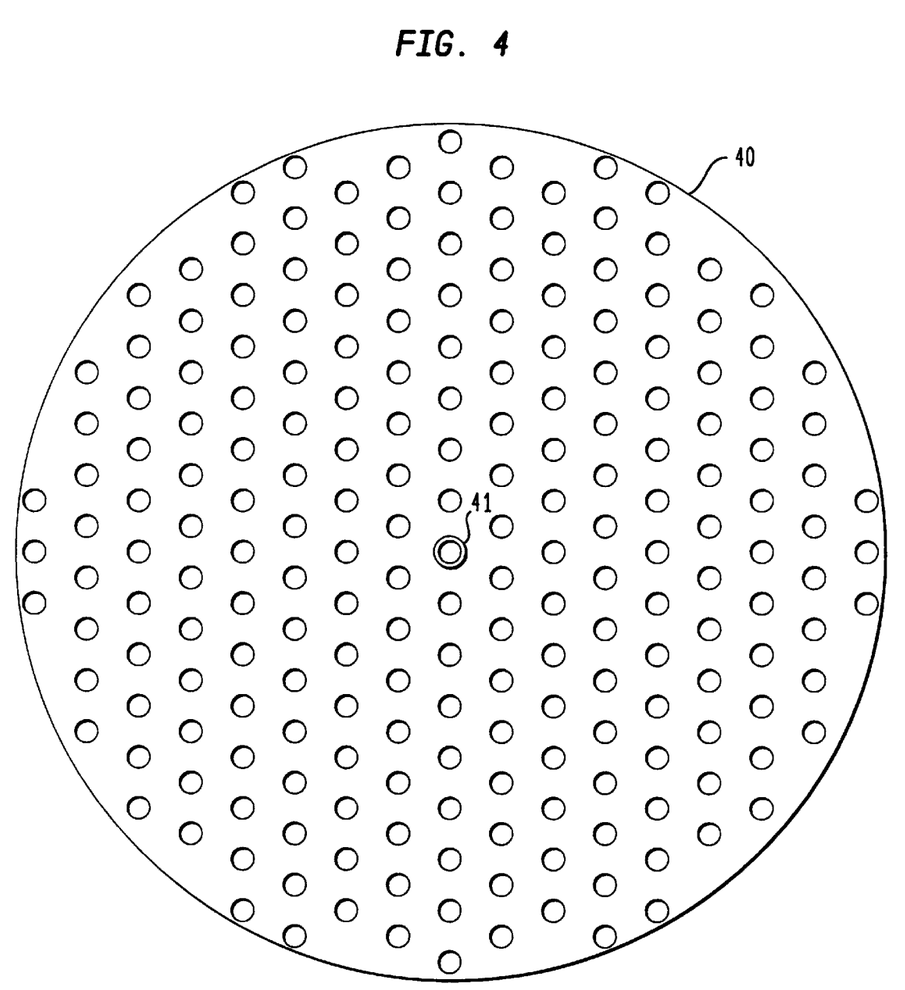
FIG. 4 is a top view of one plate of a baffle in accordance with another form of the present invention.
Figure 5:
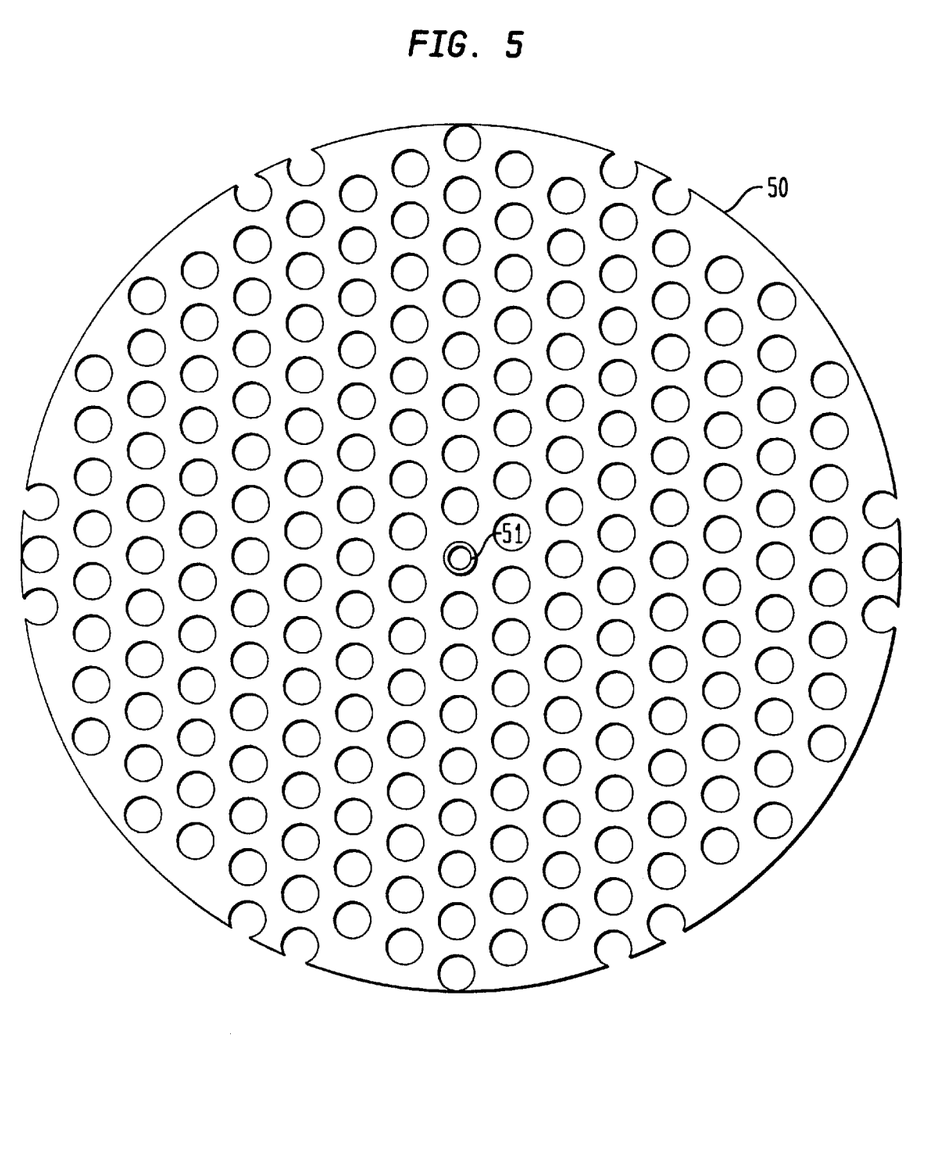
FIG. 5 is a mating plate in the baffle plate shown in FIG. 4.
Figure 9:
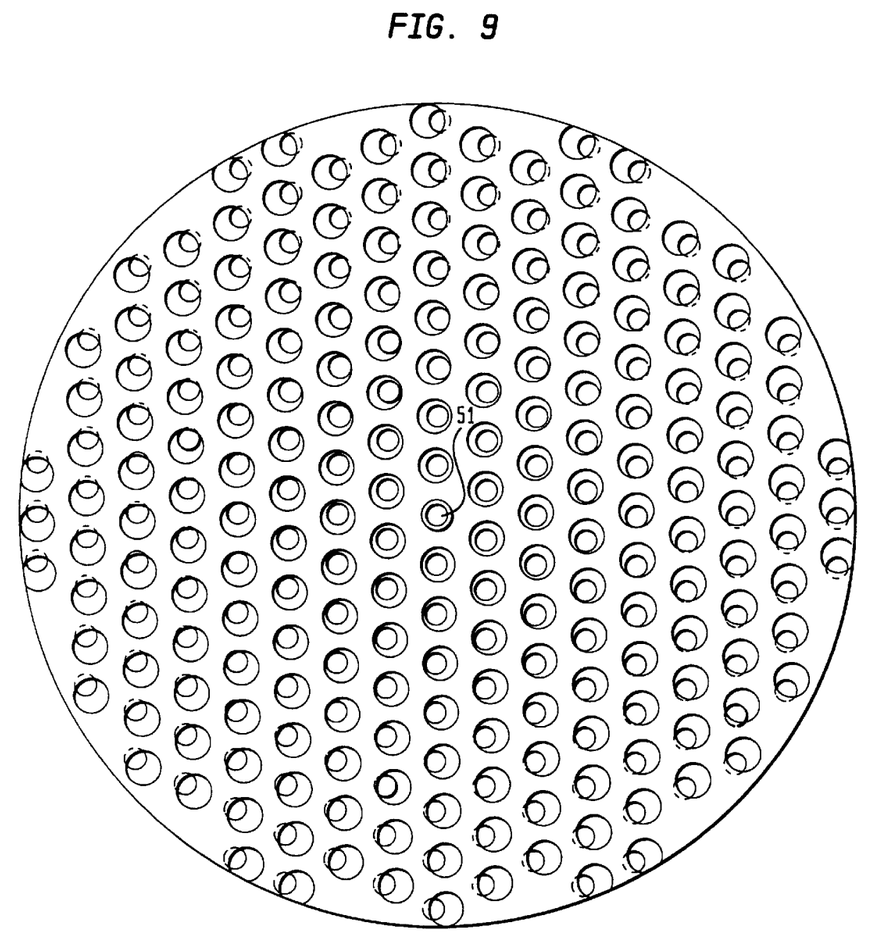
FIG. 9 is an illustration of the baffle of FIG. 6 with the plates of FIGS. 4 and 5 in slightly different radial orientation.
Figure 11:
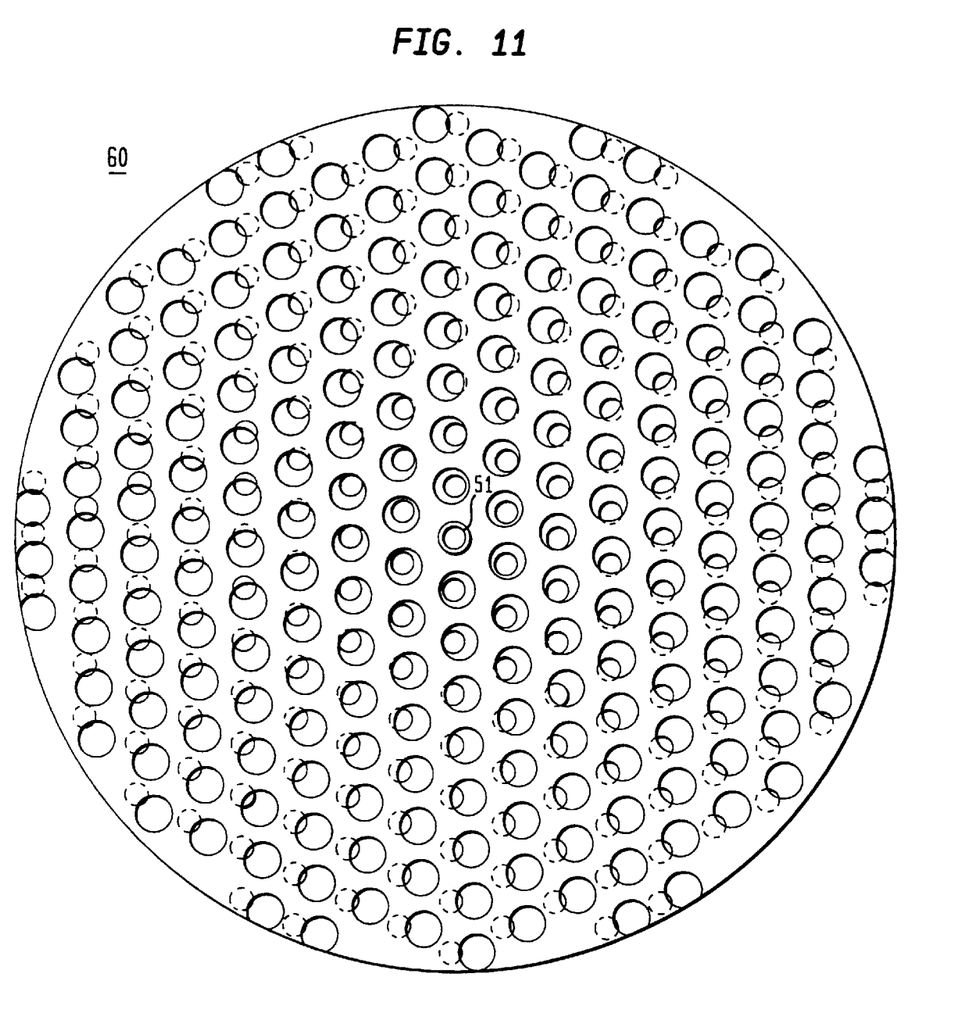
FIG. 11 is a top view of baffle of FIG. 6 in still another radial orientation of baffle plates 4 and 5.

Still another embodiment of the invention is that comprising a baffle formed of a first plate 40, shown in top view in FIG. 4, having a central grommet 41 and a plurality of openings varying in size along the radius of plate 40, the openings including, for example, openings 1 closest to the access of plate 40, and having a diameter on the order of, for example, 3/16 inch. Plate 40 also includes a second set of openings 2 at a next outer distance away from the axis plate 40, openings 2 having a diameter of, for example, on the order of 13/64 inches. Plate 40 likewise includes openings 3 at the next radial position outwardly from the axis of plate 40, openings 4 at the next successive outward location along the radius of plate 40 and openings 5 at the outer extreme on the radius of plate 40. Openings 3, 4 and 5 are of increasingly greater size, for example on the order of 7/32 inches, 15/64 inches and ¼ inches respectively, for openings 3, 4, and 5. By way of example, as shown in FIG. 4, the openings of plate 40 are in a predetermined pattern generally including a ¼ inch separation along one set of chords of plate 40 and ½ inch separation along another set of parallel chords perpendicular to the first set of chords of plate 40. In FIG. 5 is shown a second plate 50, with central grommet 41, intended to overlay and combine with plate 40 to form a baffle 6 as shown in FIGS. 6, 9, and 11.

Plate 50 includes a plurality of openings of constant dimension, for example on the order of 3/8 inch, but in a pattern corresponding to that of the openings in mating plate 40. Alternatively, the holes in plates 40 and 50 may both be of constant dimensions.

Figure 6:
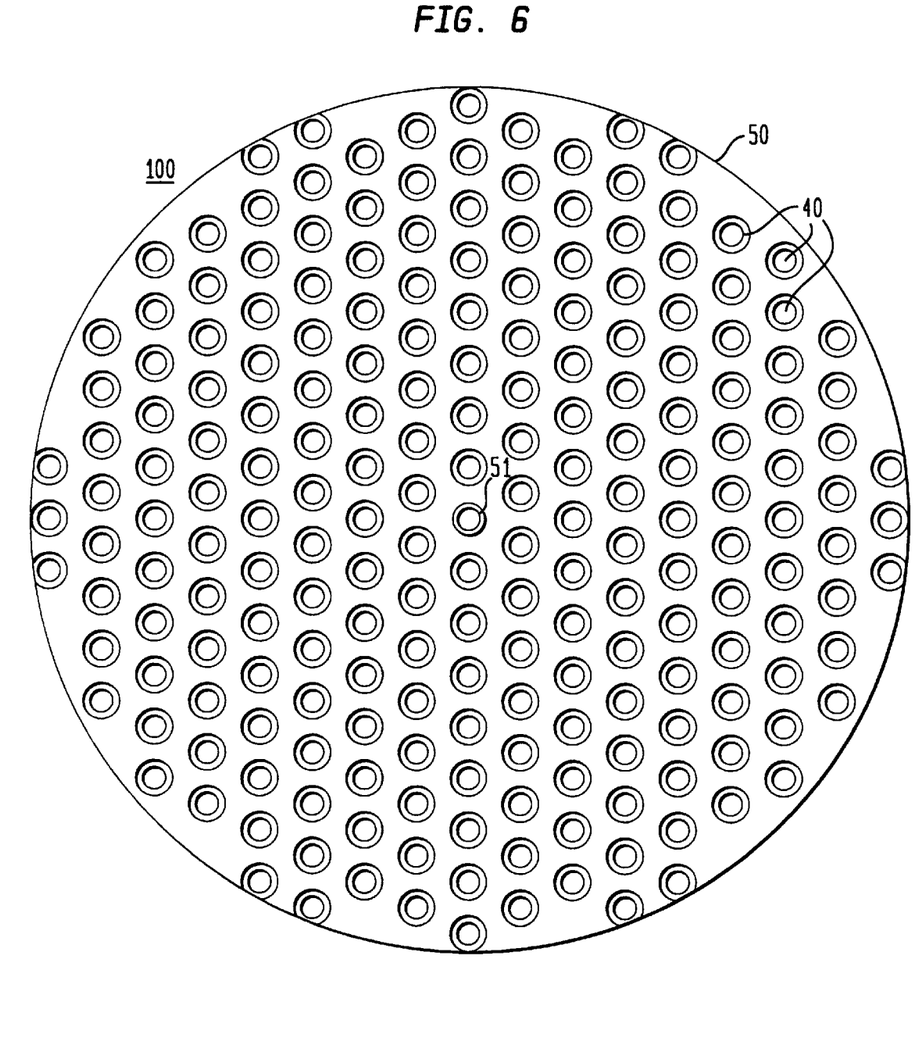
FIG. 6 is a top view of the plates of FIGS. 4 and 5 overlying one another in their configuration to serve as a baffle, and in a first preselected radial orientation.

As assembled, plates 40 and 50 are shown in FIG. 6 as baffle 60.

In a configuration of baffle 60 shown in FIG. 6, the respective openings of plates 40 and 50 align, the varying flow-through overlying openings of plates 40 and 50 defining a cross-sectional area which increases radially outward from the axis of baffle 60 because of the increasing diameter of openings in underlying plate 40.

Figure 7:
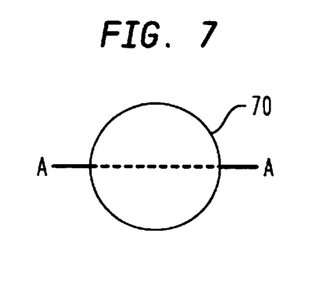
FIG. 7 is a diagramatical illustration of a silicon wafer target to be plated in accordance with the present invention utilizing a baffle such as that shown in FIG. 6.
Figure 8:
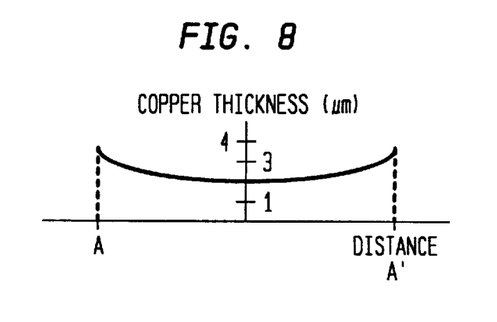
FIG. 8 is a graphical representation of expected differential plating thickness along the diametrical cross section A–A' of the wafer shown FIG. 7.

In this orientation, referred to as a zero-degree orientation, that is with no radial offset of the opening patterns in plates 40 and 50, the expected diametric variation in plating thickness of a target copper electrolytic deposition wafer along the cross-sectional diameter A–A' of wafer 70 in FIG. 7 is shown graphically in FIG. 8. This reflects correspondingly less plating thickness near the center of wafer 70 and greater wafer thickness near the outer circumference thereof.

Figure 10:
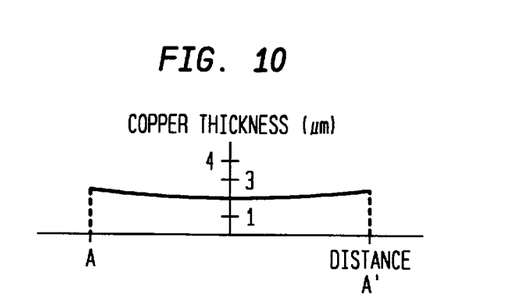
FIG. 10 is a graphical representation of the plating thickness that may be produced in accordance with the baffle of FIG. 9 at a preselected radial orientation of the respective baffle plates as shown in FIG. 9.

As shown in FIG. 9, baffle 60 may also produce a more constant flow-through cross-sectional area along the radius of baffle 60 with the respective openings of plates 40 and 50 and displaced 1.8 degrees so that the larger openings of top plate 50 are partially obscured by the axially displaced openings of underlying plate 40 and this obscuration increases along the radius of baffle 50. Thus, the thickness of plating thickness on wafer target 70 should approach linearity along the whole length of the diameter of wafer 70, as graphically depicted in FIG. 10.

Figure 12:
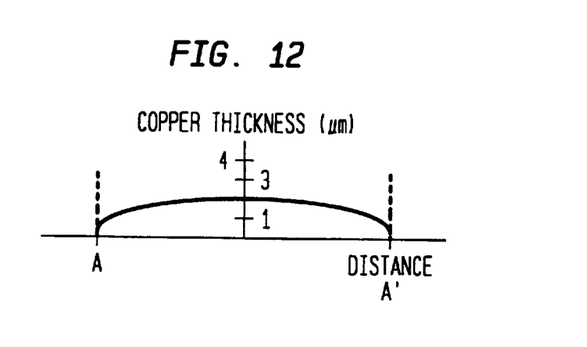
FIG. 12 is a graphical representation of the differential plating thickness that may be produced utilizing the radial orientation of baffle plates shown in FIG. 11.
Figure 13:
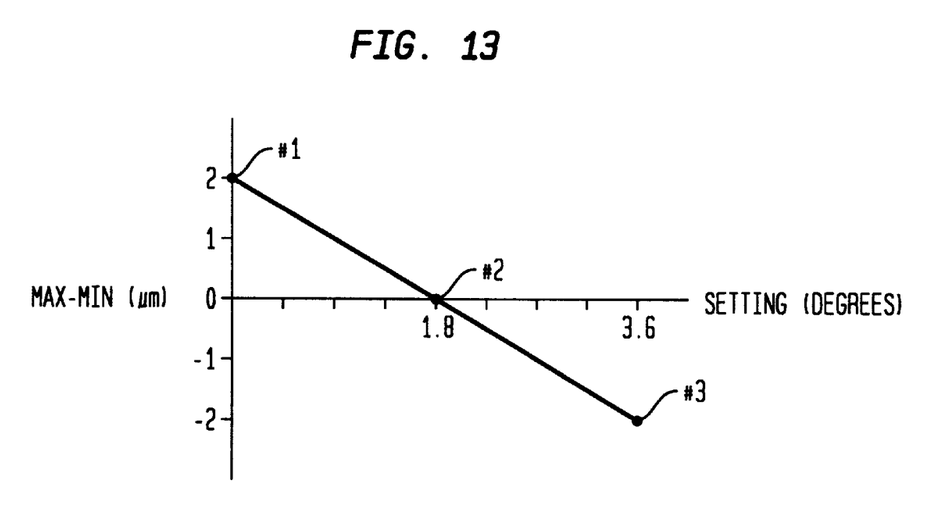
FIG. 13 is a graphical representation of the diametric plating thickness that may be attained at a given location of a target wafer as the radial orientation of the respective plates in a baffle in accordance with the present invention varies.

Still another disposition of baffle 60 is shown in FIG. 11, wherein the openings of the respective plates 40 and 50 are displaced 3.6 degrees, with even greater obscuration of the openings outwardly along the radius of baffle 6 so that correspondingly less free flow-through area is projected to the axially-flowing deposition bath. The resultant plating thickness is projected as shown in FIG. 12 to include a somewhat greater thickness near the center of wafer 70 and substantially less thickness near the outer edges thereof. Thus, adjustment of the relative radial positions of baffles 40 and 50 may produce a variation in plating thickness at a given location, as shown in FIG. 13. Adjustment of the mating plates of a baffle in accordance with the present invention thus may be used to effect a differential plating thickness along the radius or diameter of a plating target or, by periodic adjustment during the deposition process, compensate for partial depletion of the plating flux, to the extent that partial depletion differs along the radius of the cross section of the flux stream.

Typically the plates of a baffle, such as baffle 60 in the above embodiment, would be mounted on legs or standoff at their peripheries. Means for radially adjusting the position of at least one of the plates, such as by manual movement or by a mechanical or electronic mechanism, would also be provided.

Although this invention has been described with respect to specific embodiments thereof, it is not limited thereto. Instead, the appended claims are intended to be construed to encompass not only those specific embodiment described and illustrated but to such other variants and embodiments as may be made by those skilled in the art without departing from the true spirit and scope of the present invention.

What is claimed:

1. In a method of treating a planar substrate wherein said treatment is effected by causing a material to flow toward said substrate from a location spaced therefrom, the improvement comprising:

interposing between said location and said substrate a baffle for modifying the uniformity of material flow in a plane parallel to said substrate, said baffle including at least two planar members disposed parallel to said substrate, each of said planar members having at least one opening therethrough, at least one of said planar members being independently movable within its respective plane, said movement and the disposition of said openings causing at least one such opening on one of said members to move selectively into and out of registry with an opening on the other of said members;

adjusting said movable baffle plate to a predetermined position of registration between said openings, wherein the registration of openings on one of said plates with openings on the other of said plates is controllably varied with the radial position thereof; and causing material to flow from said location toward said substrate and through said baffle, said baffle causing a redistribution of the flow rate of said material toward said substrate in the plane of said baffle and thereby effecting the uniformity of treatment thereof.

2. The method, as recited in claim 1, wherein said material is caused to flow toward said substrate by an electromotive force.

3. The method, as recited in claim 1, wherein said substrate comprises one electrode of an electrolytic cell.

4. The method, as recited in claim 3, wherein said substrate is a silicon wafer axially spaced from and parallel to said baffle plates, and said material flowing toward said substrate comprises a copper ion flux from which a copper coating is electrolytically deposited on said silicon wafer.

5. The method, as recited in claim 3, further comprising adjusting said baffle plates to increase copper ion flux in that part of said wafer away from the center thereof relative to that at the center thereof, and continuing said deposition until said copper coating is one half to 2 microns thick.

6. The method, as recited in claim 4, wherein said baffle comprises two circular plates, each of which has a plurality of openings therethrough, at least some of said openings being varyingly registrable with some of said openings on the other of said members, when one of said members overlies the other of said members and one of said members is rotatably adjusted with respect to the other of said members.

7. The method, as recited in claim 4, wherein said baffle comprises two circular plates, one of which has at least one plurality of holes disposed on a radial line thereof, and the other of which has at least one plurality of holes on a line skewed with respect to a radial line thereof.

8. The method, as recited in claim 7, wherein each of said planar members includes from three to ten of said pluralities of openings.

9. The method, as recited in claim 7, wherein each of said planar members includes eight of said pluralities of openings.

10. The method of treating a planar substrate of claim 1, wherein said rotatably adjustable baffle rotates only during adjustment.

11. A baffle for controlling the cross-sectional flow rate of a material flowing therethrough, said baffle comprising two parallel plates overlying one another and having a common axis therethrough, one being rotatably adjustable about said axis with respect to the other, each of said plates having a plurality of openings therethrough, the disposition of said openings on one of said plates differing from that on the other of said plates, such that rotational adjustment of said adjustable plate causes a change in the area of said plates in which the respective openings on the two members are in registration with one another.

12. The baffle, as recited in claim 11, wherein at least one plurality of the respective openings on one of said plates is disposed along a radial line thereof and the openings on the other of said plates include at least one plurality of openings disposed along a line extending from near the axis thereof toward the outer edge of said plate away from said axis, said line crossing and forming an angle with radial lines of said other member.

13. The baffle, as recited in claim 12, wherein said plates each include one or more pluralities of openings, the pluralities of openings on one of said plates being radially disposed thereon and the pluralities on the other of said plates beings disposed along lines extending from near the axis of said plate and toward the edge of said plate away therefrom and at an angle to radial lines thereof.

14. A baffle, as recited in claim 11, wherein the diameters of openings on at least one of said plates increase or decrease along the radius of said plate.

15. A baffle, as recited in claim 14, wherein all openings on one of said plate are of a common diameter and are located in a predetermined pattern on said plate, and openings on the other of said plate are located in the same predetermined pattern as that on the first of said plate.

16. A baffle, as recited in claim 15, wherein the openings on the other of said plates vary in diameter from the axial center of said plate outwardly.

17. The baffle for controlling the cross-sectional flow rate of a material flowing therethrough of claim 11, wherein said rotatably adjustable baffle rotates only during adjustment.

* * * * *